United States Patent
Hou et al.

(10) Patent No.: US 9,449,828 B2
(45) Date of Patent: Sep. 20, 2016

(54) METHOD OF FORMING METAL GATE ELECTRODE

(71) Applicant: TAIWAN SEMICONDUCTOR MANUFACTURING COMPANY, LTD., Hsinchu (TW)

(72) Inventors: Cheng-Hao Hou, Hsinchu (TW); Peng-Soon Lim, Johor (MY); Da-Yuan Lee, Jhubei (TW); Xiong-Fei Yu, Hsinchu (TW); Chun-Yuan Chou, Taipei (TW); Fan-Yi Hsu, Toufen Town (TW); Jian-Hao Chen, Hsinchu (TW); Kuang-Yuan Hsu, Fongyuan (TW)

(73) Assignee: TAIWAN SEMICONDUCTOR MANUFACTURING COMPANY, LTD. (TW)

( * ) Notice: Subject to any disclaimer, the term of this patent is extended or adjusted under 35 U.S.C. 154(b) by 0 days.

(21) Appl. No.: 14/936,939

(22) Filed: Nov. 10, 2015

(65) Prior Publication Data

US 2016/0064223 A1 Mar. 3, 2016

Related U.S. Application Data

(60) Continuation of application No. 14/018,087, filed on Sep. 4, 2013, now Pat. No. 9,196,691, which is a division of application No. 13/189,732, filed on Jul. 25, 2011, now Pat. No. 8,546,885.

(51) Int. Cl.
  *H01L 21/28* (2006.01)
  *H01L 29/49* (2006.01)
  *H01L 29/66* (2006.01)
  (Continued)

(52) U.S. Cl.
  CPC ... *H01L 21/28026* (2013.01); *H01L 21/28088* (2013.01); *H01L 29/401* (2013.01); *H01L 29/4966* (2013.01); *H01L 29/66477* (2013.01); *H01L 29/66545* (2013.01);
  (Continued)

(58) Field of Classification Search
  CPC .......... H01L 29/401; H01L 21/28088; H01L 29/4966; H01L 29/66545; H01L 29/78; H01L 29/51; H01L 21/28026; H01L 29/66477
  See application file for complete search history.

(56) References Cited

U.S. PATENT DOCUMENTS

2003/0216038 A1  11/2003 Madhukar et al.
2006/0278934 A1  12/2006 Nagahama
(Continued)

FOREIGN PATENT DOCUMENTS

CN  101438389  5/2009

*Primary Examiner* — Peniel M Gumedzoe
(74) *Attorney, Agent, or Firm* — Hauptman Ham, LLP

(57) ABSTRACT

An aspect of this description relates to a method that includes partially filling an opening in a dielectric material with a high-dielectric-constant material. The method also includes partially filling the opening with a first metal material over the high-dielectric-constant material. The method further includes filling the opening with a capping layer over the first metal material. The method additionally includes partially removing the first metal material and the capping layer in the opening using a wet etching process in a solution including one or more of $H_2O_2$, $NH_4OH$, $HCl$, $H_2SO_4$ or diluted HF. The method also includes fully removing the remaining capping layer in the opening using a wet etching process in a solution includes one or more of $NH_4OH$ or diluted HF. The method further includes depositing a second metal material in the opening over the remaining first metal material.

20 Claims, 9 Drawing Sheets

(51) Int. Cl.
    *H01L 29/40*     (2006.01)
    *H01L 29/78*     (2006.01)
    *H01L 29/51*     (2006.01)

(52) U.S. Cl.
    CPC .............. *H01L 29/51* (2013.01); *H01L 29/78* (2013.01); *H01L 2924/0002* (2013.01)

(56) References Cited

U.S. PATENT DOCUMENTS

2007/0262451 A1    11/2007   Rachmady et al.
2008/0185637 A1*   8/2008   Nagaoka ........... H01L 29/66545
                                                                                               257/327

\* cited by examiner

METHOD OF FORMING METAL GATE ELECTRODE

PRIORITY CLAIM

The present invention is a continuation of U.S. application Ser. No. 14/018,087, filed Sep. 4, 2013, which is a divisional of U.S. application Ser. No. 13/189,732, filed Jul. 25, 2011, now U.S. Pat. No. 8,546,885, issued Oct. 1, 2013, the disclosures of which are incorporated herein by reference in their entireties.

FIELD OF THE INVENTION

The invention relates to integrated circuit fabrication and, more particularly, to a method of making a Field Effect Transistor with a metal gate electrode.

BACKGROUND

Semiconductor devices are used in a large number of electronic devices, such as computers, cell phones, and others. Semiconductor devices comprise integrated circuits (ICs) that are formed on semiconductor wafers by depositing many types of thin films of material over the semiconductor wafers, and patterning the thin films of material to form the ICs. The ICs include field-effect transistors (FETs), such as metal-oxide-semiconductor field effect transistors (MOSFETs).

As technology nodes shrink, in some IC designs, there has been a desire to replace the typically polysilicon gate electrode with a metal gate electrode to improve device performance with the decreased feature sizes. One process of forming the metal gate electrode is termed a "gate last" process in which the final metal gate electrode is fabricated after all of the other transistor components, which allows for a reduced number of subsequent processes, including high temperature processing, that must be performed after formation of the gate.

However, there are challenges to implementing such features and processes in complementary metal-oxide-semiconductor (CMOS) fabrication. As the gate length and spacing between devices decrease, these problems are exacerbated. For example, in a "gate last" fabrication process, it is difficult to achieve a low gate resistance for a FET because voids are generated in the metal gate electrode after metal layer deposition for gap filling of a high-aspect-ratio trench, thereby increasing the likelihood of device instability and/or device failure.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

It is understood that the following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. Various features may be arbitrarily drawn in different scales for simplicity and clarity. In addition, the present disclosure provides examples of a "gate last" metal gate process, however, one skilled in the art may recognize applicability to other processes and/or use of other materials.

Figure 1:
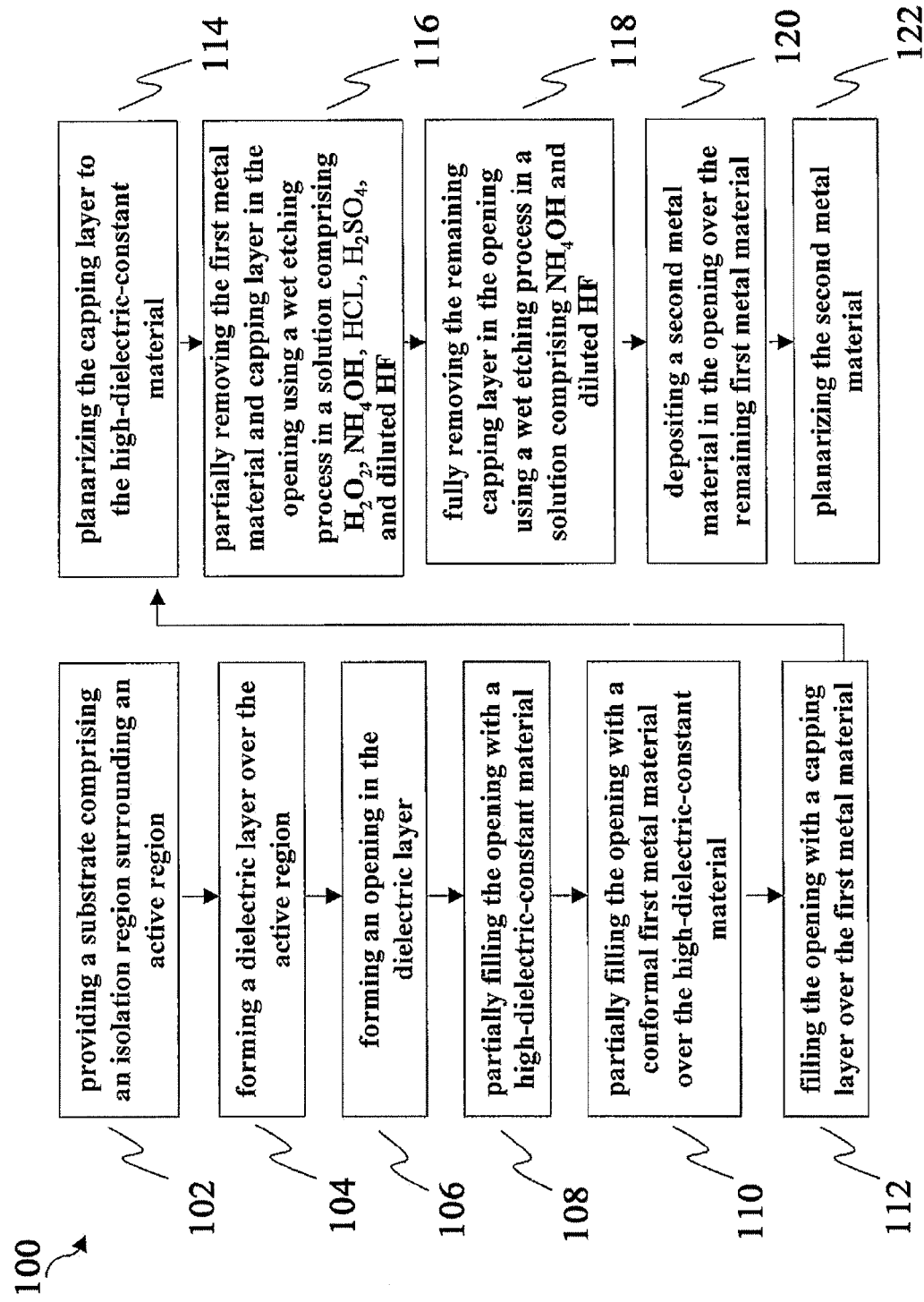
FIG. 1 is a flowchart illustrating a method of fabricating a metal gate electrode of a Field Effect Transistor according to various aspects of the present disclosure.

Referring to FIG. 1, illustrated is a flowchart of a method 100 of fabricating a metal gate electrode of a field effect transistor according to various aspects of the present disclosure. The method 100 begins with step 102 in which a substrate comprising an isolation region surrounding an active region is provided. The method 100 continues with step 104 in which a dielectric layer is formed over the active region. The method 100 continues with step 106 in which an opening is formed in the dielectric layer. The method 100 continues with step 108 in which the opening is partially filled with a high-dielectric-constant (high-k) material. The method 100 continues with step 110 in which the opening is partially filled with a conformal first metal material over the high-dielectric-constant material. The method 100 continues with step 112 in which the opening is filled with a capping layer over the first metal material. The method 100 continues with step 114 in which the capping layer is planarized to the high-dielectric-constant material. The method 100 continues with step 116 in which the first metal material and capping layer in the opening are partially removed using a wet etching process in a solution comprising $H_2O_2$, $NH_4OH$, HCl, $H_2SO_4$, and diluted HF. The method 100 continues with step 118 in which the remaining capping layer in the opening is fully removed using a wet etching process in a solution comprising $NH_4OH$ and diluted HF. The method 100 continues with step 120 in which a second metal material is deposited in the opening over the remaining first metal material. The method 100 continues with step 122 in which the second metal material is planarized. The discussion that follows illustrates an embodiment of a metal gate electrode of a field effect transistor that can be fabricated according to the method 100 of FIG. 1.

Figure 2A:
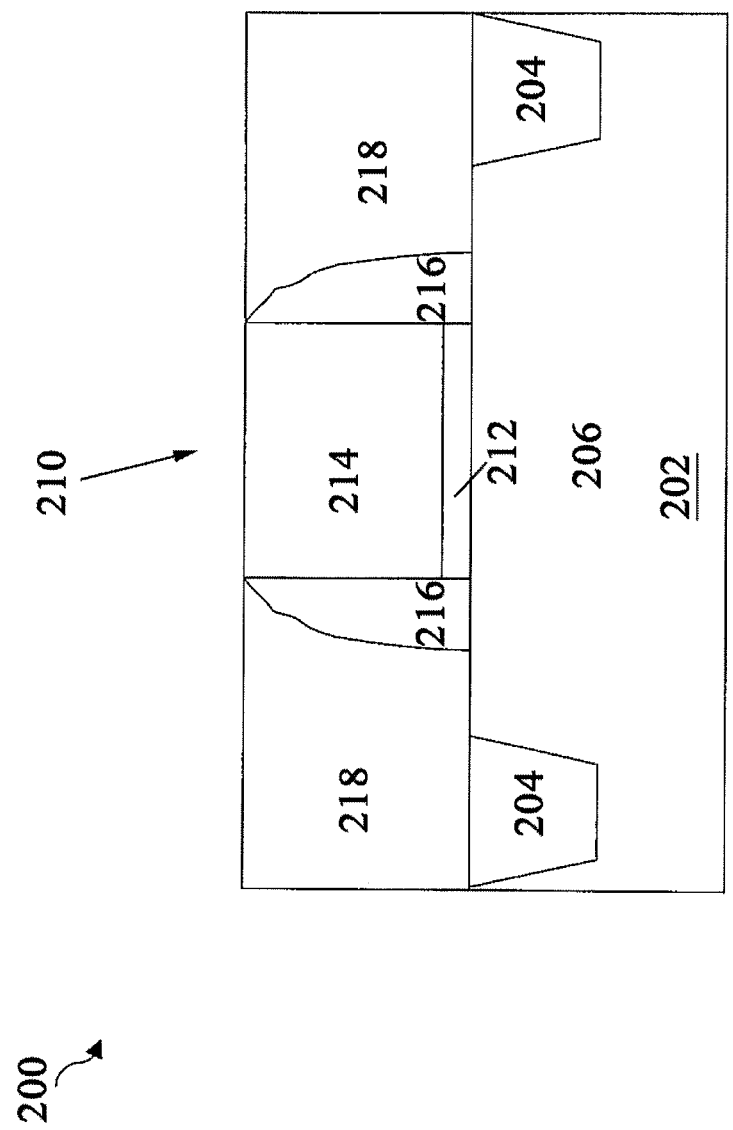
FIGS. 2A-H show schematic cross-sectional views of a Field Effect Transistor comprising a metal gate electrode at various stages of fabrication according to various aspects of the present disclosure.
Figure 2B:
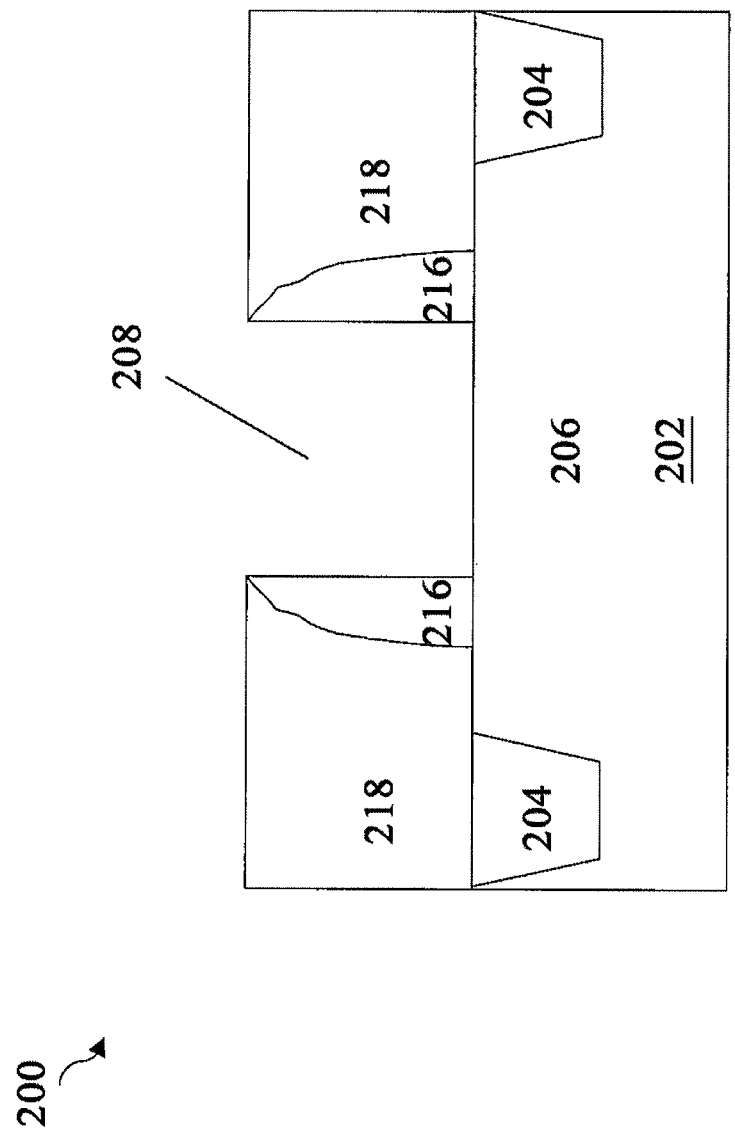
Figure 2C:
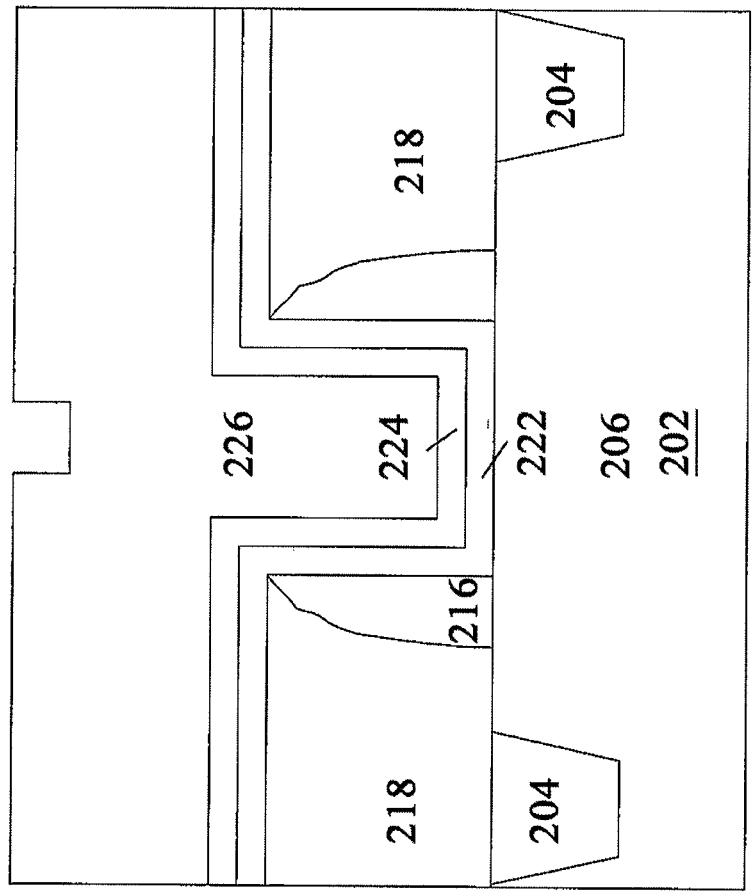
Figure 2D:
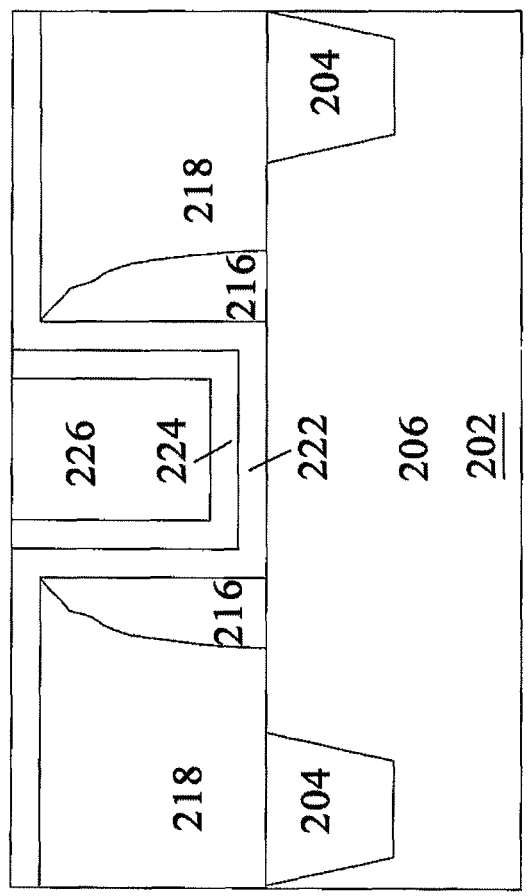
Figure 2E:
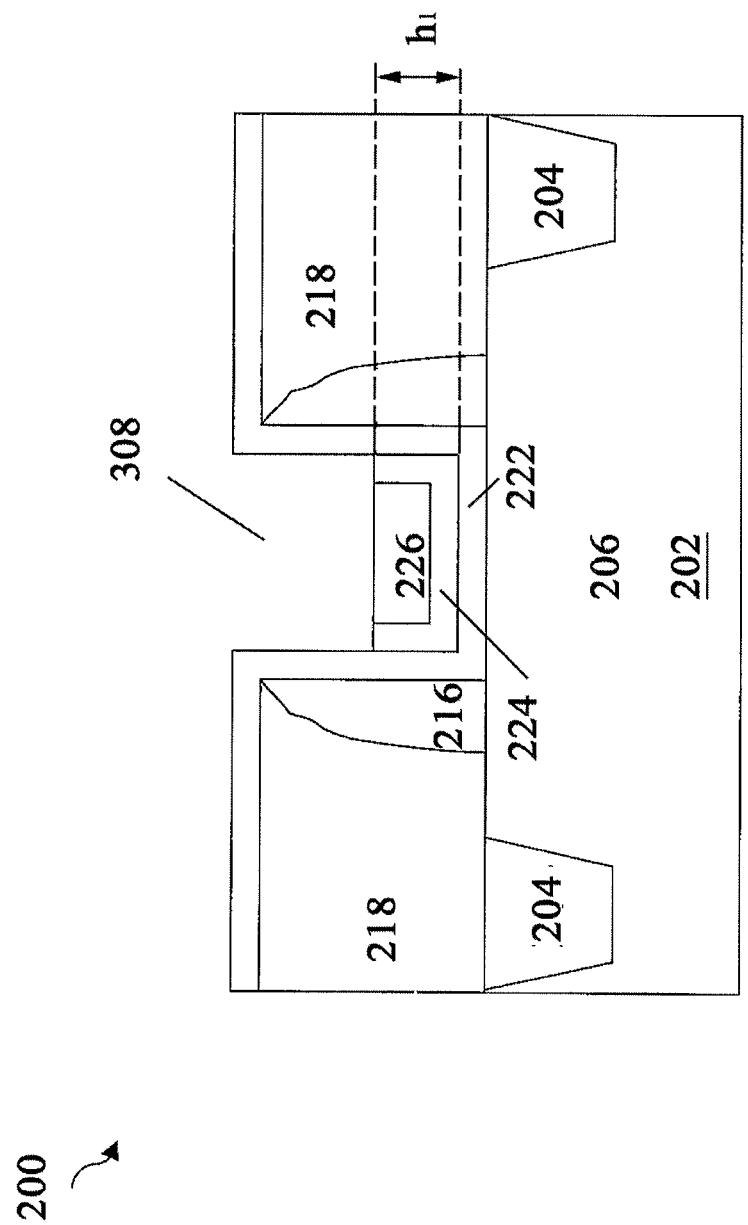
Figure 2F:
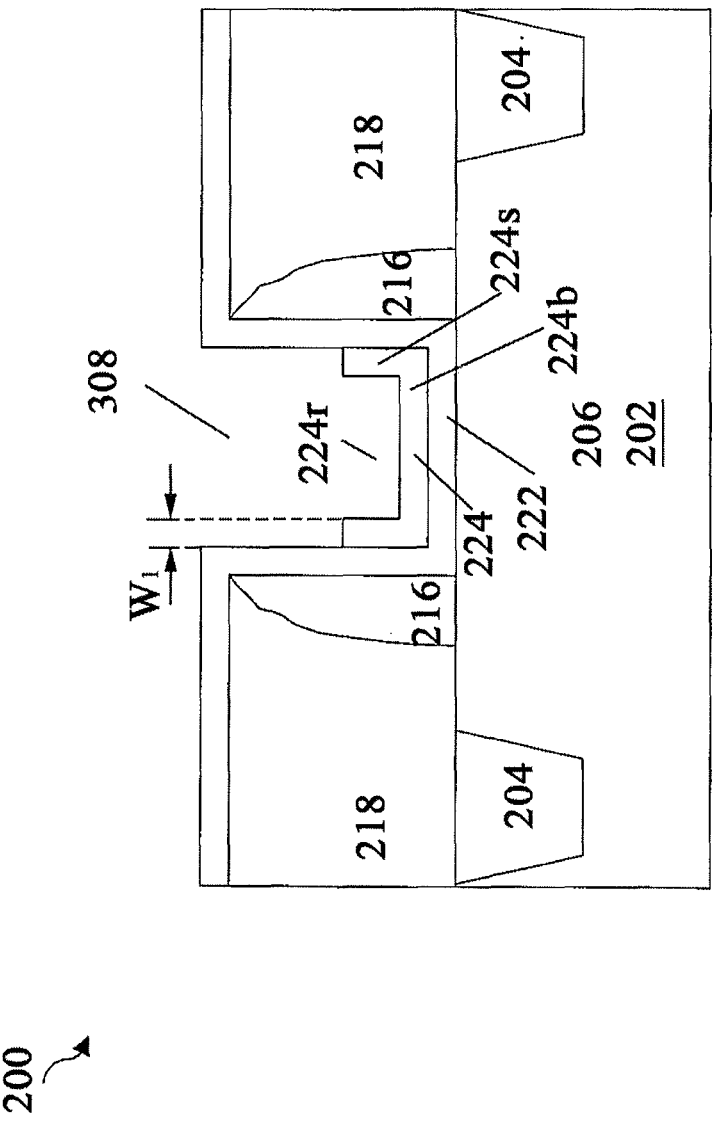
Figure 2G:
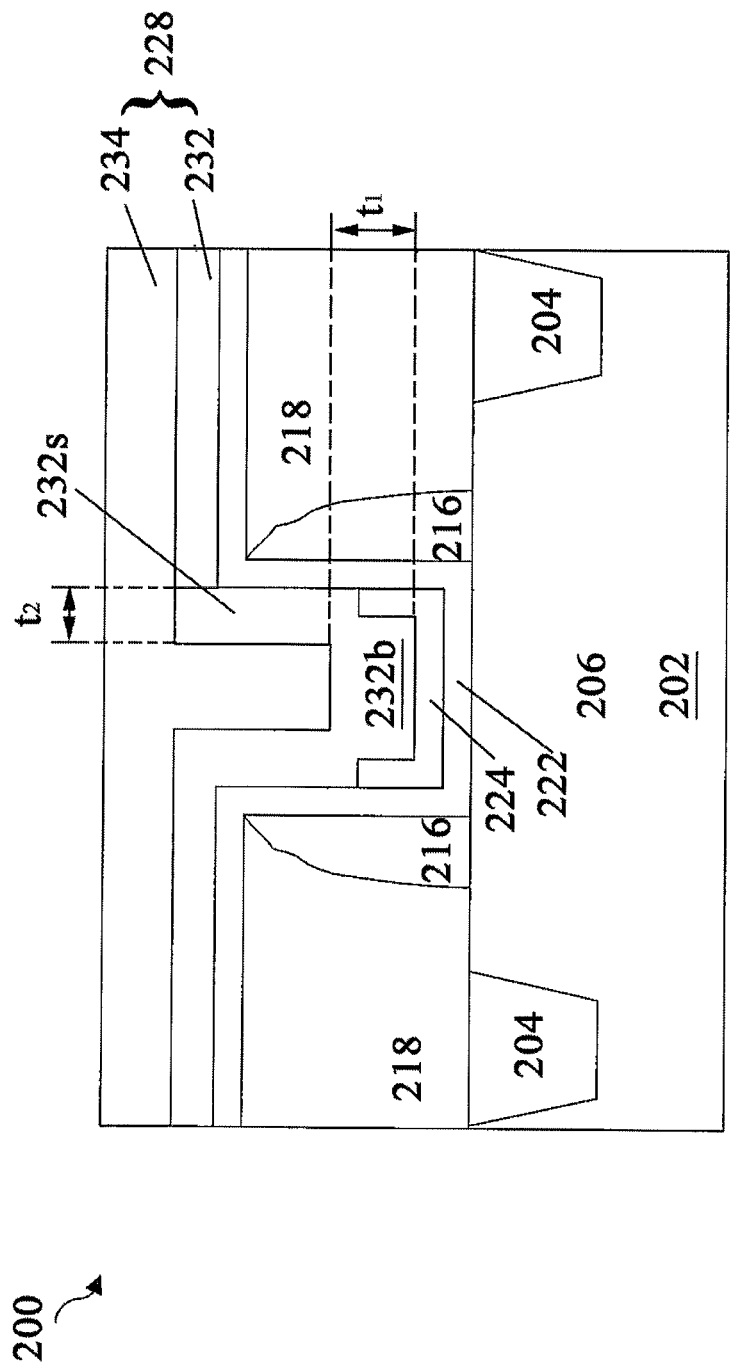
Figure 2H:
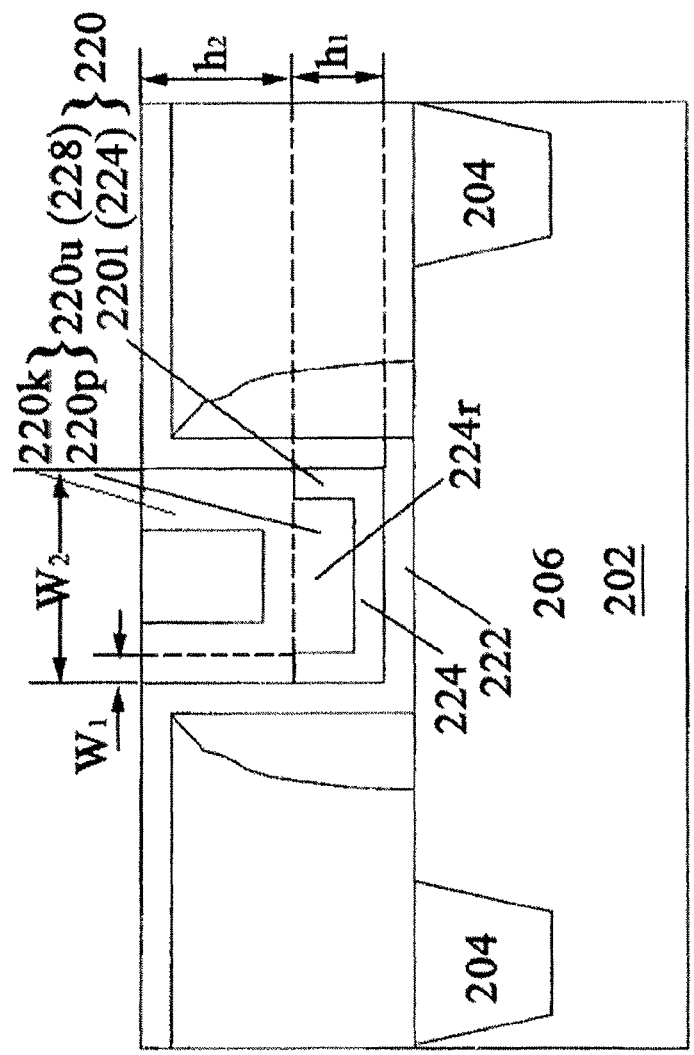

FIGS. 2A-H show schematic cross-sectional views of a field effect transistor (FET) 200 comprising a metal gate electrode 220 at various stages of fabrication according to various aspects of the present disclosure. It is noted that the method of FIG. 1 does not produce a completed FET 200. A completed FET 200 may be fabricated using complementary metal-oxide-semiconductor (CMOS) technology processing. Accordingly, it is understood that additional processes may be provided before, during, and after the method 100 of FIG. 1, and that some other processes may only be briefly described herein. Also, FIGS. 1 through 2H are simplified for a better understanding of the inventive concepts of the present disclosure. For example, although the figures illustrate a metal gate electrode 220 for the FET 200, it is understood the integrated circuit (IC) may comprise a number of other devices comprising resistors, capacitors, inductors, fuses, etc.

Referring to FIG. 2A, a substrate 202 is provided. The substrate 202 may comprise a silicon substrate. The substrate 202 may alternatively comprise silicon germanium, gallium arsenic, or other suitable semiconductor materials. The substrate 202 may further comprise other features such as various doped regions, a buried layer, and/or an epitaxial (epi) layer. Furthermore, the substrate 202 may be a semiconductor on insulator such as silicon on insulator (SOI). In other embodiments, the semiconductor substrate 202 may comprise a doped epi layer, a gradient semiconductor layer, and/or may further include a semiconductor layer overlying another semiconductor layer of a different type such as a silicon layer on a silicon germanium layer. In other examples, a compound semiconductor substrate may comprise a multilayer silicon structure or a silicon substrate may include a multilayer compound semiconductor structure.

In the present embodiments, the substrate 202 may comprise an isolation region 204 surrounding an active region 206. The active region 206 may include various doping configurations depending on design requirements. In some embodiments, the active region 206 may be doped with p-type or n-type dopants. For example, the active region 206 may be doped with p-type dopants, such as boron or $BF_2$; n-type dopants, such as phosphorus or arsenic; and/or combinations thereof. The active region 206 may be configured for an N-type metal-oxide-semiconductor field effect transistor (referred to as an NMOS) or for a P-type metal-oxide-semiconductor field effect transistor (referred to as a PMOS).

The isolation regions 204 may utilize isolation technology, such as local oxidation of silicon (LOCOS) or shallow trench isolation (STI), to define and electrically isolate the various active regions 206. In the present embodiment, the isolation region 204 comprises a STI. The isolation regions 204 may comprise materials such as silicon oxide, silicon nitride, silicon oxynitride, fluoride-doped silicate glass (FSG), a low-dielectric-constant (low-k) material, and/or combinations thereof. The isolation regions 204, and in the present embodiment, the STI, may be formed by any suitable process. As one example, the formation of the STI may include patterning the semiconductor substrate 202 by a photolithography process, etching a trench in the substrate 202 (for example, by using a dry etching, wet etching, and/or plasma etching process), and filling the trench (for example, by using a chemical vapor deposition process) with a dielectric material. In some embodiments, the filled trench may have a multi-layer structure such as a thermal oxide liner layer filled with silicon nitride or silicon oxide.

In a gate last process, a dummy gate structure 210 comprising a dummy oxide 212 and a dummy gate electrode 214 is formed on the substrate 202. The dummy gate structure 210 may be formed using any suitable process, including the processes described herein. In one example, the dummy oxide 212 and dummy gate electrode 214 are sequentially deposited on the substrate 202. In the present embodiment, the dummy oxide 212 may be formed of silicon oxide grown by a thermal oxidation process, having a thickness of about 10 to 30 Angstroms (Å). For example, the dummy oxide 212 can be grown by the rapid thermal oxidation (RTO) process or in an annealing process comprising oxygen.

In some embodiments, the dummy gate electrode 214 may comprise a single layer or multilayer structure. In the present embodiment, the dummy gate electrode 214 may comprise polysilicon. Further, the dummy gate electrode 214 may be doped polysilicon with the same or different doping. The dummy gate electrode 214 comprises any suitable thickness. In the present embodiment, the dummy gate electrode 214 comprises a thickness in the range of about 30 nm to about 60 nm. The dummy electrode 214 may be formed using a low-pressure chemical vapor deposition (LPCVD) process.

A layer of photoresist is formed over the dummy gate electrode 214 by a suitable process, such as spin-on coating, and patterned to form a patterned photoresist feature by a proper lithography patterning method. A width of the patterned photoresist feature is in the range of about 15 to 32 nm. The patterned photoresist feature can then be transferred using a dry etching process to the underlying layers (i.e., the dummy oxide 212 and the dummy gate electrode 214) to form the dummy gate structure 210. The photoresist layer may be stripped thereafter. It is understood that the above examples do not limit the processing steps that may be utilized to form the dummy gate structure 210.

After formation of the dummy gate structure 210, a dielectric layer 216 is deposited over the dummy gate structure 210 and extending over the active region 206. The dielectric layer 216 may be formed of silicon oxide, silicon nitride or other suitable materials by a chemical vapor deposition (CVD) process. A portion of the dielectric layer 216 over a top surface of the dummy gate structure 210 is removed using a dry etching process to form a pair of gate spacers 216 on opposite sidewalls of the dummy gate structure 210. For example, the dry etching process may be performed using $CH_2F_2$, $O_2$, and Ar as etching gases.

It is noted that the FET 200 may undergo other CMOS technology processing to form various features of the FET 200. As such, the various features are only briefly discussed herein. The various components of the FET 200 are formed prior to formation of the metal gate electrode 220 in a "gate last" process. The various components may comprise source/drain (n-type and p-type S/D) regions (not shown) and lightly doped source/drain (n-type and p-type LDD) regions (not shown) in the active region 206 on opposite sides of the metal gate electrode 220. The n-type S/D and LDD regions may be doped with P or As, and the p-type S/D and LDD regions may be doped with B or In.

Then, an interlayer dielectric (ILD) layer 218 is deposited over the dummy gate structure 210, the pair of gate spacers 216 and extending over the substrate 202. The ILD 218 may include an oxide formed by a high aspect ratio process (HARP) and/or high density plasma (HDP) deposition process. A chemical mechanical polishing (CMP) is performed on the ILD 218 to expose the dummy gate structure 210.

The dummy gate structure 210 may then be removed thereby forming an opening 208 in the dielectric layer 216 (i.e., between the gate spacers 216) (shown in FIG. 2B). The dummy gate electrode 214 may be removed using a wet etch and/or a dry etch process. In one embodiment, a wet etch process includes exposure to a hydroxide solution containing ammonium hydroxide, diluted HF, deionized water, and/or other suitable etchant solutions. In another embodiment, a dry etch process may be performed under a source power of about 650 to 800 W, a bias power of about 100 to 120 W, and a pressure of about 60 to 200 mTorr, using $Cl_2$, HBr and He as etching gases. Further, the dummy oxide 212 may be removed using a wet etch. The wet etch process includes exposure to a diluted HF solution, and/or other suitable etchant solutions.

Referring to FIG. 2C, following formation of the opening 208 in the dielectric layer 216, the opening 208 is partially filled with a high-dielectric-constant (high-k) material 222. In one embodiment, the high-k material 222 comprises certain metal oxides. Examples of metal oxides used for the high-k material 222 include oxides of Li, Be, Mg, Ca, Sr, Sc, Y, Zr, Hf, Al, La, Ce, Pr, Nd, Sm, Eu, Gd, Tb, Dy, Ho, Er, Tm, Yb, Lu and mixtures thereof. In the present embodiment, the high-k material 222 comprises $HfO_x$ with a thickness in the range of about 10 to 30 angstroms. The high-k material 222 may be formed using a suitable process such as atomic layer deposition (ALD), chemical vapor deposition (CVD), physical vapor deposition (PVD), thermal oxidation, UV-ozone oxidation, or combinations thereof. The high-k material 222 may further comprise an interfacial layer (not shown) to reduce damage between the high-k material 222 and the substrate 202. The interfacial layer may comprise silicon oxide.

The opening 208 is partially filled with a conformal first metal material 224 over the high-k material 222. In the present embodiment, the conformal first metal material 224 is deposited before a second metal material 228 (shown in FIG. 2H) to reduce diffusion of a signal metal 228b to the high-k material 222. In one embodiment, the conformal first metal material 224 comprises a material selected from a group of TiN, TaN, and WN. The conformal first metal material 224 has a thickness ranging from 5 to 15 angstroms. The conformal first metal material 224 may be formed by CVD, PVD, or other suitable technique.

The opening 208 is filled with a capping layer 226 over the conformal first metal material 224. In some embodiments, the capping layer 226 may comprise a single layer or multilayer structure. In the present embodiment, the capping layer 226 may comprise polysilicon, amorphous silicon, or silicon nitride. Further, the capping layer 226 may be doped silicon with the same or different doping. The capping layer 226 comprises any suitable thickness. In the present embodiment, the capping layer 226 comprises a thickness in the range of about 45 nm to about 65 nm. The capping layer 226 may be formed using an LPCVD process.

Then, a chemical mechanical polishing (CMP) process is performed to remove a portion of the capping layer 226 and conformal first metal material 224 outside of the opening 208. Accordingly, the CMP process may stop when reaching the high-k material 222, and thus providing a substantially planar surface (shown in FIG. 2D).

The remaining capping layer 226 within the opening 208 may be removed, thereby forming a high-aspect-ratio trench for the FET 200. The high-aspect-ratio trench may impede metal material from entering into a bottom portion of the trench and generate voids in the trench, thereby increasing the likelihood of device instability and/or device failure.

Accordingly, the processing discussed below with reference to FIGS. 2E-2H may remove at least an upper portion of the conformal first metal material 224 to lower the aspect ratio of the trench to make it easier for further metal depositions into the trench. This can reduce void generation in a metal gate electrode in a high-aspect-ratio trench and upgrade device performance.

FIG. 2E shows the FET 200 of FIG. 2D after the conformal first metal material 224 and capping layer 226 in the opening 208 are partially removed using a wet etching process in a solution comprising $H_2O_2$, $NH_4OH$, HCl, $H_2SO_4$, and diluted HF. The etching process forms a trench 308 within the opening 208. The remaining first metal material 224 within the opening 208 may have a maximum height $h_1$ ranging from about 1.5 to about 45 nm. The height $h_1$ can be achieved through tuning various parameters of the etching process such as time and etching chemistry.

Referring to FIG. 2F, following partially removing the conformal first metal material 224 and capping layer 226 in the opening 208, the remaining capping layer 226 in the opening 208 is fully removed using a wet etching process in a solution comprising $NH_4OH$ and diluted HF. The process steps up to this point have provided a substrate having a low-aspect-ratio trench 308 to make it easier for further metal depositions into the trench 308. This can reduce void generation in a metal gate electrode in a high-aspect-ratio trench and upgrade device performance.

In the present embodiment, the remaining first metal material 224 within the opening 208 forms a lower portion 220l of the metal gate electrode 220 (shown in FIG. 2H). In one embodiment, the lower portion 220l is substantially U-shaped. In another embodiment, the lower portion 220l has a recess 224r, a bottom portion 224b and sidewall portions 224s, wherein each of the sidewall portions 224s has a first width $W_1$.

Referring to FIG. 2G, after removal of the remaining capping layer 226 in the opening 208, a second metal material 228 is deposited over the first metal material 224 to fill the trench 308. In the present embodiment, a work-function metal 232 is first deposited over the first metal material 224, and a signal metal 234 is then deposited over the work-function metal 232. The work-function metal 232 and signal metal 234 are combined and referred to as the second metal material 228. Further, the thickness of the second metal material 228 will depend on the depth of the trench 308. The second metal material 228 is thus deposited until the trench 308 is substantially filled.

In an NMOS embodiment, the second metal material 228 may comprise an N-work-function metal. In some embodiments, the N-work-function metal comprises a metal selected from a group of Ti, Ag, Al, TiAl, TiAlN, TaC, TaCN, TaSiN, Mn, and Zr. In some embodiments, the N-work-function metal may be formed by CVD, PVD, plating, spin-on, ALD, or other suitable technique. In a PMOS embodiment, the second metal material 228 comprises a P-work-function metal. In some embodiments, the P-work-function metal comprises a metal selected from a group of TiN, WN, TaN, and Ru. In some embodiments, the P-work-function metal may be formed by CVD, PVD, plating, spin-on, ALD, or other suitable technique.

In a PVD embodiment, the work-function metal 232 comprises a bottom portion 232b having a first thickness $t_1$ and sidewall portions 232s having a second thickness $t_2$ less than the first thickness $t_1$. In one embodiment, a ratio of the second thickness $t_2$ to the first thickness $t_1$ is from 0.5 to 0.9. In an ALD embodiment, the work-function metal 232 comprises a bottom portion 232b having a first thickness $t_1$ and sidewall portions 232s having a second thickness $t_2$ substantially equal to the first thickness $t_1$.

Further, the signal metal 234 may comprise a material selected from a group of Al, Cu, Co and W. The signal metal 234 may be formed by CVD, PVD, plating, spin-on, ALD, or other suitable technique. In some embodiments, the signal metal 234 may comprise a laminate. The laminate may further comprise a barrier metal layer, a linear metal layer or a wetting metal layer.

Referring to FIG. 2H, another CMP is performed to planarize the second metal material 228 after filling the trench 308. Since the CMP removes a portion of the second metal material 228 outside of the trench 308, the CMP process may stop when reaching the high-k material 222, and thus provide a substantially planar surface.

In the present embodiment, the first metal material 224 and the second metal material 228 in the opening 208 are combined and referred to as the metal gate electrode 220. In one embodiment, the second metal material 228 within the opening 208 forms an upper portion 220u of the metal gate electrode 220. In one embodiment, the upper portion 220u is substantially T-shaped. In some embodiments, the upper portion 220u has a protrusion 220p and a bulk portion 220k, wherein the bulk portion 220k has a second width $W_2$, wherein the protrusion 220p extends into the recess 224r of the lower portion 220l, wherein a ratio of the second width $W_2$ to the first width $W_1$ is from about 5 to 10. In some embodiments, the upper portion 220u has a minimum height $h_2$. A ratio of the maximum height ($h_1$) of the lower portion 220l to a minimum height ($h_2$) of the upper portion 220u is from 0.1 to 0.9. Accordingly, Applicant's method of fabricating a FET 200 may fabricate a void-free metal gate electrode to reduce gate resistance and upgrade device performance.

In one embodiment, a metal gate electrode for a field effect transistor comprises a lower portion formed of a first metal material, wherein the lower portion has a recess, a bottom portion and sidewall portions, wherein each of the sidewall portions has a first width; and an upper portion formed of a second metal material, wherein the upper portion has a protrusion and a bulk portion, wherein the bulk portion has a second width, wherein the protrusion extends into the recess, wherein a ratio of the second width to the first width is from about 5 to 10.

In another embodiment, a method of fabricating a metal gate electrode of a Field Effect Transistor comprises providing a substrate comprising an isolation region surrounding an active region; forming a dielectric layer over the active region; forming an opening in the dielectric layer; partially filling the opening with a high-dielectric-constant material; partially filling the opening with a conformal first metal material over the high-dielectric-constant material; filling the opening with a capping layer over the first metal material; planarizing the capping layer to the high-dielectric-constant material; partially removing the first metal material and capping layer in the opening using a wet etching process in a solution comprising $H_2O_2$, $NH_4OH$ and diluted HF; fully removing the remaining capping layer in the opening using a wet etching process in a solution comprising $NH_4OH$ and diluted HF; depositing a second metal material in the opening over the remaining first metal material; and planarizing the second metal material.

It is understood that the FET 200 may undergo further CMOS process flow to form various features such as contacts/vias, interconnect metal layers, dielectric layers, passivation layers, etc.

An aspect of this description relates to a method comprising partially filling an opening in a dielectric material with a high-dielectric-constant material. The method also comprises partially filling the opening with a first metal material over the high-dielectric-constant material. The method further comprises filling a remaining portion of the opening with a capping layer over the first metal material. The method additionally comprises partially removing the first metal material and the capping layer in the opening using a first wet etching process. The method also comprises fully removing the remaining capping layer in the opening using a second wet etching process. The method further comprises depositing a second metal material in the opening over the remaining first metal material.

Another aspect of this description relates to a method of fabricating a metal gate electrode of a field effect transistor. The method comprises removing a portion of a dielectric layer to form an opening in the dielectric layer, the dielectric layer being over a substrate. The method also comprises filling the opening, wherein filling the opening comprises filling the opening with a high-dielectric-constant material, a conformal first metal material over the high-dielectric-constant material, and a capping layer over the first metal material. The method further comprises planarizing the capping layer to expose the high-dielectric-constant material. The method additionally comprises partially removing the first metal material and capping layer in the opening using a first wet etching process. The method also comprises fully removing the remaining capping layer in the opening using a second wet etching process. The method additionally comprises depositing a second metal material in the opening over the remaining first metal material.

A further aspect of this description relates to a method comprising partially filling an opening in a dielectric layer with a first material to form a first portion of an electrode. The first portion of the electrode being is formed comprising a bottom portion having a first surface extending in a first direction, a first sidewall portion having a second surface at a first side of the first surface, the second surface extending in a second direction different from the first direction, a second sidewall portion having a third surface at a second side of the first surface, the third surface extending in a third direction different from the first direction, and a first recess defined by the first surface, the second surface and the third surface. The method also comprises partially filling the opening in the dielectric layer with a second material different from the first material to form a second portion of the electrode over the first portion of the electrode. The second portion of the electrode is formed comprising a protrusion portion within the first recess, a bulk portion, and a second recess defined by the bulk portion and the protrusion portion. The method further comprises filling the second recess with a signal metal. The signal metal is accommodated within the second recess such that the second portion of the electrode has a thickness between the first surface and a nearest bottom surface of the signal metal. At least one of the second surface or the third surface extends from the first surface in a direction toward the signal metal. At least one of the second surface or the third surface has a length from the first surface to an end of the second surface or an end of the third surface less than the thickness of the second portion of the electrode.

While the invention has been described by way of example and in terms of the exemplary embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method, comprising:
   partially filling an opening in a dielectric material with a high-dielectric-constant material;
   partially filling the opening with a first metal material over the high-dielectric-constant material;
   filling a remaining portion of the opening with a capping layer over the first metal material;
   partially removing the first metal material and the capping layer in the opening using a first wet etching process;
   fully removing the remaining capping layer in the opening using a second wet etching process; and
   depositing a second metal material in the opening over the remaining first metal material.

2. The method of claim 1, further comprising:
planarizing the capping layer to be coplanar with the high-dielectric-constant material.

3. The method of claim 1, wherein the second metal material is deposited having a bottom portion and sidewall portions, the bottom portion is formed having a first thickness in a first direction, the sidewall portions are formed having a second thickness in a second direction different from the first direction, and the second thickness is less than the first thickness.

4. The method of claim 1, wherein the second metal material is deposited having a bottom portion and sidewall portions, the bottom portion is formed having a first thickness in a first direction, the sidewall portions are formed having a second thickness in a second direction different from the first direction, and the second thickness is substantially equal to the first thickness.

5. The method of claim 1, wherein depositing the second metal material comprises depositing a work-function metal into the opening.

6. The method of claim 1, further comprising:
planarizing the second metal material.

7. The method of claim 1, wherein the first wet etching process is different from the second wet etching process.

8. The method of claim 1, wherein the first wet etching process uses a first solution comprising one or more of $H_2O_2$, $NH_4OH$, $HCl$, $H_2SO_4$ or diluted HF.

9. The method of claim 8, wherein the second wet etching process uses a second solution comprising one or more of $NH_4OH$ or diluted HF.

10. A method of fabricating a metal gate electrode of a field effect transistor, the method comprising:
removing a portion of a dielectric layer to form an opening in the dielectric layer, the dielectric layer being over a substrate;
filling the opening, wherein filling the opening comprises filling the opening with a high-dielectric-constant material, a conformal first metal material over the high-dielectric-constant material, and a capping layer over the first metal material;
planarizing the capping layer to expose the high-dielectric-constant material;
partially removing the first metal material and capping layer in the opening using a first wet etching process;
fully removing the remaining capping layer in the opening using a second wet etching process; and
depositing a second metal material in the opening over the remaining first metal material.

11. The method of claim 10, wherein the capping layer is formed by depositing polysilicon, amorphous silicon or silicon nitride over the first metal material.

12. The method of claim 10, wherein the first wet etching process uses a first solution comprising at lease one chemical compound included in a second solution used in the second wet etching process.

13. The method of claim 10, wherein the first wet etching process uses a solution comprising $H_2O_2$, $NH_4OH$, $HCl$, $H_2SO_4$ and diluted HF.

14. The method of claim 10, wherein the second wet etching process uses a solution comprising $NH_4OH$ and diluted HF.

15. A method, comprising:
partially filling an opening in a dielectric layer with a first material to form a first portion of an electrode, the first portion of the electrode being formed comprising:
a bottom portion having a first surface extending in a first direction;
a first sidewall portion having a second surface at a first side of the first surface, the second surface extending in a second direction different from the first direction;
a second sidewall portion having a third surface at a second side of the first surface, the third surface extending in a third direction different from the first direction; and
a first recess defined by the first surface, the second surface and the third surface;
partially filling the opening in the dielectric layer with a second material different from the first material to form a second portion of the electrode over the first portion of the electrode, the second portion of the electrode being formed comprising:
a protrusion portion within the first recess;
a bulk portion; and
a second recess defined by the bulk portion and the protrusion portion; and
filling the second recess with a signal metal,
wherein
the signal metal is accommodated within the second recess such that the second portion of the electrode has a thickness between the first surface and a nearest bottom surface of the signal metal,
at least one of the second surface or the third surface extends from the first surface in a direction toward the signal metal, and
at least one of the second surface or the third surface has a length from the first surface to an end of the second surface or an end of the third surface less than the thickness of the second portion of the electrode.

16. The method of claim 15, wherein partially filling the opening in the dielectric layer with the first material comprises:
depositing a first metal into the opening in the dielectric layer.

17. The method of claim 16, wherein partially filling the opening in the dielectric layer with the second material comprises:
depositing a second metal into the first recess.

18. The method of claim 15, further comprising:
removing a portion of the dielectric layer over an active region of a substrate to form the opening in the dielectric layer.

19. The method of claim 18, wherein the substrate is exposed by removing the portion of the dielectric layer, and the method further comprises:
growing an oxide layer within the opening by performing a rapid thermal oxidation process on the substrate.

20. The method of claim 16, further comprising:
removing substrate material to form a trench in the substrate surrounding the active region of the substrate; and
filling the trench with a dielectric material to form an isolation region in the substrate.

* * * * *